United States Patent [19]

Cappa

[11] 4,151,425

[45] Apr. 24, 1979

[54] VOLTAGE SEQUENCING CIRCUIT FOR SEQUENCING VOLTAGES TO AN ELECTRICAL DEVICE

[75] Inventor: Maurus Cappa, Unionville, Canada

[73] Assignee: International Business Machines Corporation, Armonk, N.Y.

[21] Appl. No.: 868,247

[22] Filed: Jan. 10, 1978

[30] Foreign Application Priority Data

Mar. 3, 1977 [CA] Canada ................................ 273926

[51] Int. Cl.² ...................... H03K 17/60; H03K 17/28
[52] U.S. Cl. ..................................... 307/130; 307/141;
   307/242; 307/297; 361/83; 361/89; 328/259;
   307/200 A
[58] Field of Search ................ 307/75, 130, 242, 253,
   307/254, 297, 246, 141, 141 R, 200 A; 328/259;
   325/151; 361/83, 89, 6, 75

[56] References Cited

U.S. PATENT DOCUMENTS

| | | | |
|---|---|---|---|
| 3,421,087 | 1/1969 | Schunemann et al. | 325/151 |
| 3,575,619 | 4/1971 | Frank | 307/246 X |
| 3,578,983 | 5/1971 | Kondo | 307/253 |
| 3,610,948 | 10/1971 | Waaben | 307/202 |
| 3,725,675 | 4/1973 | Olsen | 307/297 |
| 3,732,442 | 5/1973 | Husbands et al. | 307/304 |
| 3,733,498 | 5/1973 | Watson | 307/297 |
| 3,860,855 | 1/1975 | Caswell | 361/89 |
| 3,886,410 | 5/1975 | Seer, Jr. | 307/297 |

Primary Examiner—L. T. Hix
Assistant Examiner—James Dwyer
Attorney, Agent, or Firm—Robert J. Haase

[57] ABSTRACT

The present invention provides means for sequencing various supply voltages to electronic circuits and devices to thereby protect those circuits and devices from exposure to deleterious voltages. A first transistor switch connects a first voltage source to a first output terminal. A second transistor switch is connected to the control electrode of the first transistor switch. The second transistor switch, when conducting, causes the first transistor switch to conduct. The second transistor switch is turned on by a second voltage source which is connected through a delay circuit to the control electrode of the second transistor switch. The second voltage source also is connected through a diode and capacitor circuit to a second output terminal.

5 Claims, 4 Drawing Figures

VOLTAGE SEQUENCING CIRCUIT FOR SEQUENCING VOLTAGES TO AN ELECTRICAL DEVICE

BACKGROUND OF THE INVENTION

Many semiconductor circuits can be damaged by the improper application of voltage to the devices thereof. Field Effect Transistor devices are particularly sensitive to the application of a substantial positive voltage without the application of a balancing negative voltage. However, these devices are not as sensitive in the case where application of a negative voltage is effected without a compensating positive voltage. It is, therefore, desirable to arrange for the application of a negative voltage to the circuit both before application of a positive voltage and after removal of the positive voltage.

In an FET integrated circuit memory which employs both negative and positive voltage sources, the negative voltage is used to reverse bias the FET substrate. If the negative voltage is not available before the positive voltage, excessive current drain may occur in the FET device. Excessive current drain in the FET integrated circuit device can permanently damage the device. In voltage/time sensitive circuits it is often necessary to sequence the voltages to prevent spurious oscillations or erroneous timing signals from occurring.

Past attempts to resolve this problem have required that both the positive and negative voltages be derived from the same winding of a transformer. This solution is adequate for most applications if the failure occurs in the transformer or in the supply to the transformer, however, it does not ensure protection if the voltage failure occurs at some other point in the circuit. Furthermore, even if the same winding of a transformer is used for all circuit voltages one is still not assured that one voltage will not rise before another.

SUMMARY OF THE INVENTION

The present invention obviates the problems of the prior art and positively assures the sequencing of the application of voltages so as to protect the semiconductor circuit from improperly applied voltages or eliminate spurious timing signals which previously resulted from the improper sequencing of supply voltages. The invention provides circuitry which facilitates the application of the negative voltage to the semiconductor circuitry prior to the application and subsequent to the removal of the positive voltage.

The invention provides a voltage controlled semiconductor switch in the voltage supply lead furnishing the voltage to be last applied and first removed from an electrical device or circuit. A charge storage device receives charging current from the voltage source to be first applied to and last removed from the electrical device or circuit. The charge storage device enables the semiconductor switch only after the first applied voltage source is supplying a voltage of a predetermined level to the electrical device or circuit. A charge storage device in the supply lead from the first applied and last removed voltage source supplies voltage to the electrical device or circuit for a short time after interruption of the power supply.

The foregoing and other features and advantages of the invention will be apparent from the following more particular description of the preferred embodiment of the invention, as illustrated in the accompanying drawing.

BRIEF DESCRIPTION OF THE DRAWING

In order that the full advantage of the invention may be obtained preferred embodiments thereof are described in detail hereinafter with reference to the accompanying drawings in which.

DESCRIPTION OF THE PREFERRED EMBODIMENT

Supply voltages are supplied to an electrical device or circuit 1 through power sequencing circuit 2. Electrical device or circuit 1 may be of any type, however, the power sequencing circuit 2 is most useful where the electrical device or circuit 1 is a FET integrated circuit digital memory or a voltage/time sensitive circuit.

Figure 1:
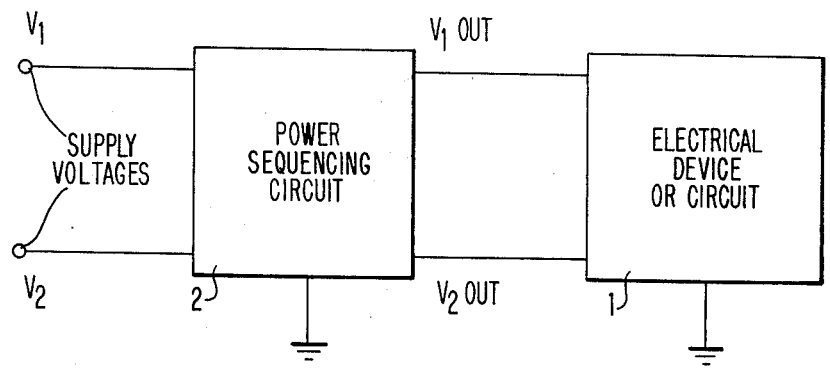
FIG. 1 is a block diagram showing the environment of the invention.
Figure 2:
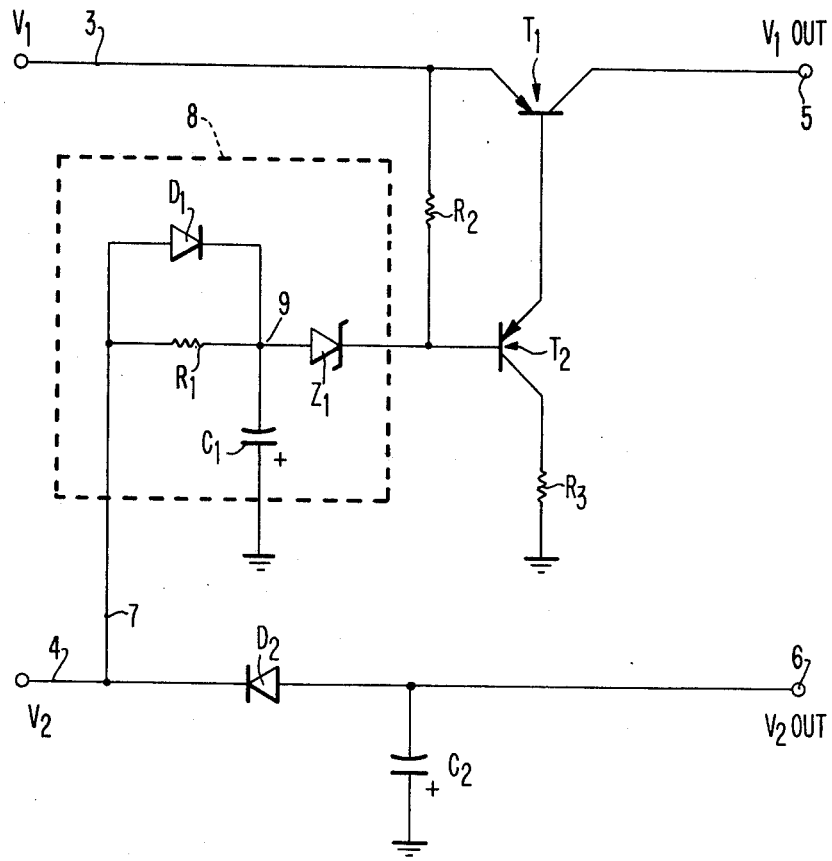
FIG. 2 shows a preferred embodiment of the invention.

The power sequencing circuit 2 is more fully shown in FIG. 2. First variable voltage level $V_1$ is applied to the emitter terminal of transistor $T_1$ via conductor 3. The collector terminal of transistor $T_1$, is connected to a first output terminal 5 which supplies a voltage level $V_1$ out to the electrical device or circuit 1 (shown in FIG. 1). A second variable voltage level $V_2$ is applied via conductors 4 and 7 to the timing control network 8 and to terminal 6 via diode $D_2$. The output terminal of the timing control network 8 is connected to the base of transistor $T_2$. The emitter of transistor $T_2$ is connected to the base of transistor $T_1$. The collector of transistor $T_2$ is grounded through resistor $R_3$. The base of transistor $T_2$ is connected by resistor $R_2$ to the emitter of transistor $T_1$.

Figure 3:
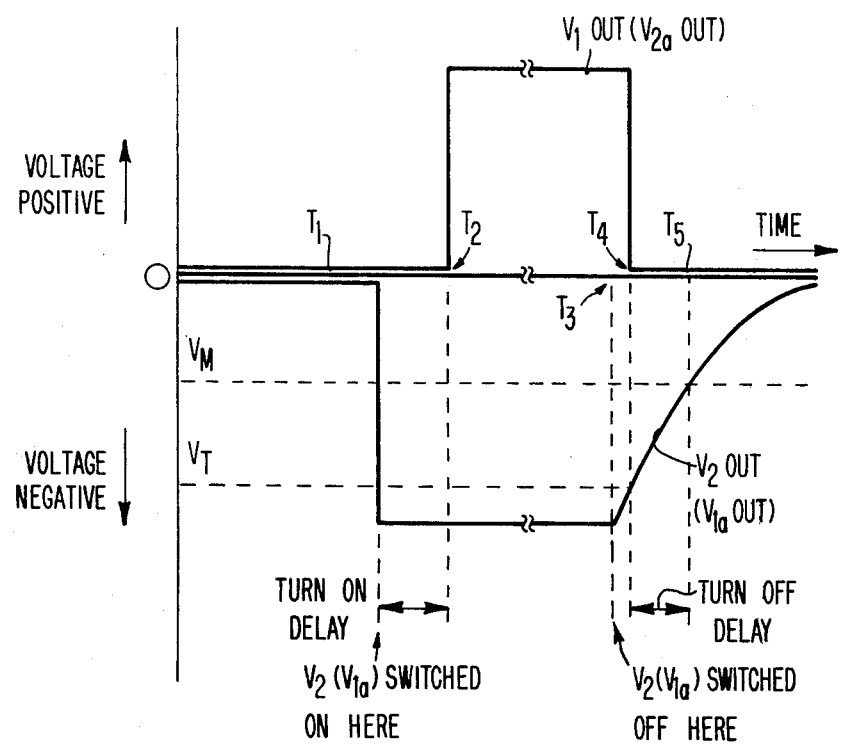
FIG. 3 is a graphical representation of the voltage wave forms during the application and removal of the supply voltages.

The operation of the sequencing circuit will now be described with reference to the voltage curves shown in FIG. 3.

In the initial state, no voltage is available to either of the input terminals of conductors 3 or 4 and, therefore, both $V_1$ out and $V_2$ out are at zero potential. If the potential on conductor 3 is raised, $V_1$ out will remain at zero potential so long as conductor 4 remains at zero potential since transistor $T_1$ is still turned off. Transistor $T_1$ can only be turned on when transistor $T_2$ is conducting. To turn transistor $T_2$ on, a sufficiently high negative voltage must be applied to terminal 4. This ensures that no voltage can be supplied to terminal 5 unless a countervailing voltage has already been supplied to terminal 6. When a negative voltage is applied to conductor 4, the voltage $V_2$ out is brought up as shown at time $T_1$ in FIG. 3. At the same time capacitor $C_1$ starts to charge through resistor $R_1$ to conductor 4. When the voltage at node 9 is sufficiently negative with respect to the voltage at the base of transistor $T_2$ to reverse bias Zener diode $Z_1$ transistor $T_2$ will turn on. When transistor $T_2$ becomes conductive current flows in the base of transistor $T_1$ thus turning on transistor $T_1$ and thereby supplying a positive potential to terminal 5 as shown at time $T_2$ in waveform $V_1$ out in FIG. 3. Resistor $R_2$ is inserted between the emitter electrode of transistor $T_1$ and the base electrode of transistor $T_2$ to compensate for any leakage in Zener diode $Z_1$ and ensures that transistor $T_2$ is off when voltage $V_2$ is off.

Zener diode $Z_1$ is chosen with a reverse break-down potential which is two or three volts less than the voltage drop between conductors 3 and 4 minus the voltage drop across the resistor $R_1$ and the emitter-base junctions of the transistors $T_1$ and $T_2$. In the present embodiment this voltage is approximately 4 to 5 volts less than the maximum voltage difference between conductors 3 and 4.

When the voltage $V_2$ at conductor 4 falls to a level $V_T$ which is insufficient to draw current through Zener diode $Z_1$, the transistor $T_2$ will turn off. When transistor $T_2$ becomes non-conductive it immediately turns off transistor $T_1$ and disconnects voltage source $V_1$ at conductor 3 from output terminal 5 thereby dropping voltage $V_1$ out to zero as shown at time $T_4$ in FIG. 3. As voltage $V_2$ drops the diode $D_2$ is reverse-biased and the output voltage $V_2$ out decays exponentially as the load draws current from capacitor $C_2$. The voltage necessary to drive the load is the minimum operating voltage $V_M$. Therefore, the turn-off delay in the circuit is the difference between time $T_4$ and $T_5$ which is the time it takes for the voltage to drop from the threshold voltage $V_t$ to the minimum operating voltage $V_m$. This delay is determined by the size of the capacitor $C_2$ and the current drain at terminal 6.

In one embodiment of the invention the following devices and parameters were used:

| | |
|---|---|
| Voltage $V_1$ | +8.5 Volts |
| Voltage $V_2$ | −12.0 Volts |
| Resistor $R_1$ | 1 KOHMS |
| Resistor $R_2$ | 10 KOHMS |
| Resistor $R_3$ | 120 OHMS |
| Capacitor $C_1$ | 100 Microfarads |
| Capacitor $C_2$ | 150 Microfarads |
| Zener diode $Z_1$ | 16 Volts |
| Diode $D_1$ | Standard Switching Diode |
| Diode $D_2$ | Standard Switching Diode |
| Transistor $T_1$ | 3 AMP Power Transistor |
| Transistor $T_2$ | 0.5 AMP Medium Power Transistor |

Figure 4:
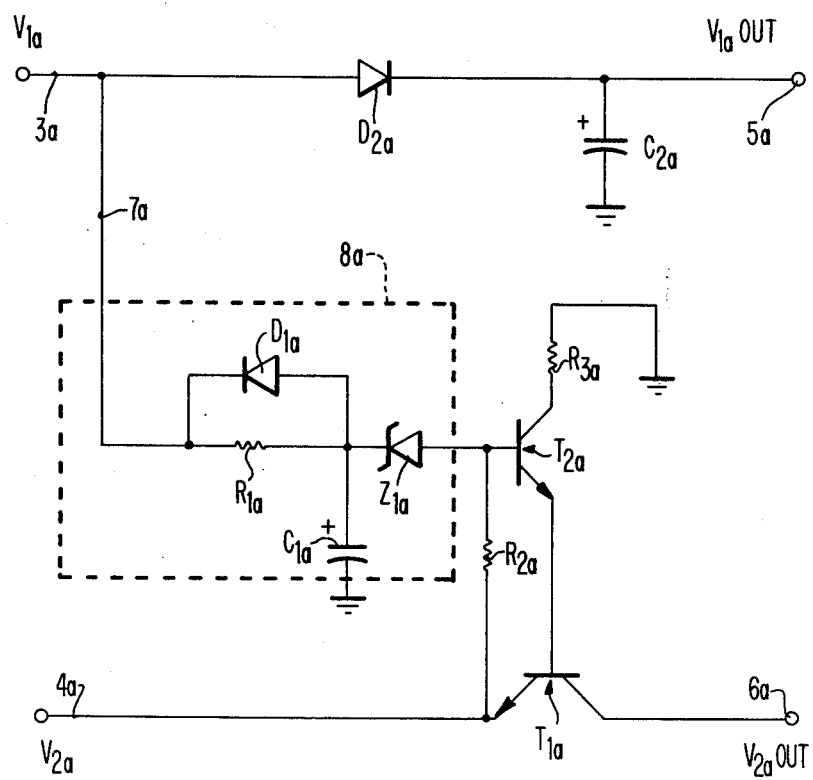
FIG. 4 shows an alternative embodiment of the invention.

In some situations, it may be desirable or necessary to ensure that a negative voltage is applied to the electrical device or circuit 1 only when a positive voltage is also applied to the device or circuit 1. This can be readily accomplished by reversing the polarity of the power sequencing circuit 2. This reversed polarity circuit is shown in FIG. 4. For ease of understanding elements of FIG. 4 corresponding to elements in FIG. 2 have been designated with the same reference characters except for the addition of the suffix a. In operation, the circuit of FIG. 4 would operate in the same manner as the circuit shown in FIG. 2 except that the positive and negative voltages at the output would be transposed so that $V_1$ out shown in FIG. 3 corresponds to $V_{2a}$ out and $V_2$ out in FIG. 3 corresponds to $V_{1a}$ out.

Other modifications to the invention are readily apparent to one skilled in the art. For example, one could easily control the application of several other voltages simply by duplicating the power sequencing circuit 2 for each voltage to be controlled.

It is also possible to construct a circuit with two or more negative voltages controlling the application of a positive voltage. In this embodiment, additional transistors such as $T_1$ are cascaded, one for each additional negative potential. In other words, the collector of one transistor feeds the emitter of the next transistor. Suitable power sequencing networks comprised to $T_2$, timing control network 8, $D_2$ and $C_2$ control the base of each $T_1$ transistor.

Further modifications and variations of the invention are readily apparent to one skilled in the art.

While the invention has been particularly shown and described with reference to the preferred embodiment thereof, it will be understood by those skilled in the art that various changes in form and details may be made therein without departing from the spirit and scope of the invention.

What is claimed is:

1. A voltage sequencing circuit for sequencing the application of voltage levels to an electrical device, said circuit comprising:
   a first transistor switch connecting a first input terminal to a first output terminal,
   a first voltage source connected to said first input terminal,
   a second transistor switch having an input electrode, an output electrode and a control electrode, said input electrode being connected to a control electrode of said first switch,
   a delay circuit connected to the control electrode of said second switch, a second input terminal connected to the input of said delay circuit,
   a second voltage source connected to said second input terminal,
   a second output terminal connected to said second input terminal, whereby said first switch is conductive only when said second switch is conductive and said delay circuit prevents said second switch from conducting until a predetermined voltage from said second voltage source has been maintained at said second input terminal for a preselected time interval.

2. A voltage sequencing network as defined in claim 1 further including a charge storage device connected to said second output terminal, said charge storage device sustaining an exponentially decaying voltage at said second output terminal after removal of the input voltage at said second input terminal.

3. A voltage sequencing network as defined in claim 1 wherein said delay circuit includes a Zener diode connected to said control electrode of said second switch.

4. A voltage sequencing network as defined in claim 1 wherein said delay circuit comprises a resistor and a Zener diode serially connected between said second input terminal and the control electrode of said second switch and a capacitor having one terminal connected to ground and the other terminal connected to a terminal common to said resistor and said Zener diode.

5. A voltage sequencing network as defined in claim 1 further including a diode connected between said second input terminal and said second output terminal.

* * * * *